(12) United States Patent
Katiyar et al.

(10) Patent No.: US 11,782,490 B2
(45) Date of Patent: Oct. 10, 2023

(54) SOFTWARE-DEFINED FAIL-SAFE POWER DRAW CONTROL FOR RACK POWER DISTRIBUTION UNITS

(71) Applicant: Dell Products L.P., Round Rock, TX (US)

(72) Inventors: Shivendra Katiyar, Bangalore (IN); Rishi Mukherjee, Bangalore (IN)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/463,780

(22) Filed: Sep. 1, 2021

(65) Prior Publication Data
US 2023/0066580 A1    Mar. 2, 2023

(51) Int. Cl.
| | | |
|---|---|---|
| G06F 1/26 | (2006.01) | |
| G06F 1/28 | (2006.01) | |
| H05K 7/14 | (2006.01) | |
| G06F 9/50 | (2006.01) | |
| G06F 11/30 | (2006.01) | |

(52) U.S. Cl.
CPC ............... *G06F 1/266* (2013.01); *G06F 1/28* (2013.01); *G06F 9/5088* (2013.01); *G06F 9/5094* (2013.01); *G06F 11/3062* (2013.01); *H05K 7/1492* (2013.01)

(58) Field of Classification Search
CPC .......... G06F 1/266; G06F 1/28; G06F 9/5088; G06F 9/5094; G06F 11/3062; H05K 7/1492
See application file for complete search history.

(56) References Cited

U.S. PATENT DOCUMENTS

| | | | |
|---|---|---|---|
| 7,269,753 B2 * | 9/2007 | Farkas .................. | H02J 3/0075 713/340 |
| 9,880,599 B1 * | 1/2018 | Allen-Ware .......... | G06F 1/3228 |
| 2004/0130292 A1 * | 7/2004 | Buchanan ............... | B60L 53/20 320/116 |
| 2009/0100275 A1 * | 4/2009 | Chang ...................... | H02J 7/00 713/300 |
| 2009/0119523 A1 * | 5/2009 | Totten ....................... | G06F 1/32 713/320 |
| 2009/0132842 A1 * | 5/2009 | Brey ...................... | G06F 1/3203 713/322 |
| 2009/0164824 A1 * | 6/2009 | Langgood ............... | H02J 3/007 713/340 |
| 2012/0054512 A1 * | 3/2012 | Archibald ................ | G06F 1/26 713/320 |

(Continued)

Primary Examiner — Phil K Nguyen
Assistant Examiner — Brian J Corcoran
(74) Attorney, Agent, or Firm — Kirton McConkie; Brian Tucker (57) ABSTRACT

Software-defined fail-safe power draw control is provided for rack power distribution units (PDUs). A PDU power manager can be used to map devices to a PDU and its sockets. The PDU power manager can also identify the power rating of the PDU and its sockets. With this information, the PDU power manager can generate and apply priority-based and dynamic power caps to the devices connected to the PDU. In this way, the PDU power manager can ensure that the power ratings of the PDU and of each of its sockets are not exceeded while ensuring that power delivery is prioritized based on the workloads that the devices may experience.

20 Claims, 7 Drawing Sheets

(56) References Cited

U.S. PATENT DOCUMENTS

| | | | |
|---|---|---|---|
| 2012/0226922 A1* | 9/2012 | Wang | G06F 1/3203 |
| | | | 713/320 |
| 2013/0283068 A1* | 10/2013 | Li | G06F 1/26 |
| | | | 713/300 |
| 2014/0330989 A1* | 11/2014 | Brewer | H02J 13/00007 |
| | | | 710/14 |
| 2016/0204608 A1* | 7/2016 | Ewing | H02J 13/00016 |
| | | | 307/38 |
| 2016/0371955 A1* | 12/2016 | Alshinnawi | G06F 13/4282 |
| 2017/0214432 A1* | 7/2017 | Cafe | H04B 3/544 |
| 2019/0041951 A1* | 2/2019 | Shapira | G06F 1/3206 |
| 2022/0171443 A1* | 6/2022 | Kumar | H02J 7/0042 |

\* cited by examiner

SOFTWARE-DEFINED FAIL-SAFE POWER DRAW CONTROL FOR RACK POWER DISTRIBUTION UNITS

CROSS-REFERENCE TO RELATED APPLICATIONS

N/A

BACKGROUND

Rack power distribution units (PDUs), also commonly called rack power strips, are used in datacenters to deliver power to devices such as servers, storage devices, switches, routers, modems, etc. In particular, PDUs have sockets (or outlets) into which such devices can be plugged.

A PDU's power rating defines the amount of sustained power the PDU can accommodate safely. Typically, a power rating is defined for the entire PDU and for each of the PDU's sockets. If the power demands of the connected device(s) exceed the power rating, the PDU's fuse will blow thereby causing a power outage. Given that connecting devices to a PDU is a manual process, it is not uncommon for power outages to occur due to human error or oversight when connecting one or more devices.

Outages can also occur after the initial connection of devices to a PDU. For example, when the devices connected to a PDU experience peak load, their collective power demand may exceed the PDU's power rating. Similarly, when a single device experiences peak load, its power demand may exceed the socket's power rating. Accordingly, it can be difficult to ensure that a PDU will be able to support the power requirements of each device and the collection of devices connected to it.

BRIEF SUMMARY

The present invention extends to systems, methods and computer program products for providing software-defined fail-safe power draw control for rack power distribution units (PDUs). A PDU power manager can be used to map devices to a PDU and its sockets. The PDU power manager can also identify the power rating of the PDU and its sockets. With this information, the PDU power manager can generate and apply ranking-based and dynamic power caps to the devices connected to the PDU. In this way, the PDU power manager can ensure that the power ratings of the PDU and of each of its sockets are not exceeded while ensuring that power delivery is prioritized based on the workloads that the devices may experience.

In some embodiments, the present invention may be implemented by a PDU power manager as method for providing software-defined fail-safe power draw control for a rack power distribution unit (PDU). The PDU power manager may identify devices that are connected to sockets of a PDU. The PDU power manager may also identify a power rating for the PDU and power ratings for the sockets of the PDU. The PDU power manager may generate device rankings for the devices that are connected to the sockets of the PDU. Based on the device rankings, the power rating for the PDU and the power ratings for the sockets of the PDU, the PDU power manager may generate power caps for the devices that are connected to the sockets of the PDU. The PDU power manager may then apply the power caps to the devices that are connected to the sockets of the PDU.

In some embodiments, the present invention may be implemented as computer storage media storing computer executable instructions which when executed implement a PDU power manager that performs a method for providing software-defined fail-safe power draw control for a rack power distribution unit (PDU). The PDU power manager may identify devices that are connected to sockets of a PDU. The PDU power manager may also identify a power rating for the PDU and power ratings for the sockets of the PDU. The PDU power manager may monitor telemetry data from the devices. Based on the telemetry data, the PDU power manager may dynamically apply power caps to the devices where a sum of the power caps is a percentage of the power rating for the PDU.

In some embodiments, the present invention may be implemented as a computing system that includes one or more processors and computer storage media storing computer executable instructions which when executed implement a method for providing software-defined fail-safe power draw control for a rack power distribution unit (PDU). Based on a power rating for a PDU and power ratings for sockets of the PDU, power caps can be applied to devices connected to the sockets of the PDU. Power draw of the devices while the power caps are applied to the devices can be monitored. Based on the monitored power draw of the devices, one or more workloads can be migrated between the devices.

This summary is provided to introduce a selection of concepts in a simplified form that are further described below in the Detailed Description. This Summary is not intended to identify key features or essential features of the claimed subject matter.

BRIEF DESCRIPTION OF THE DRAWINGS

Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
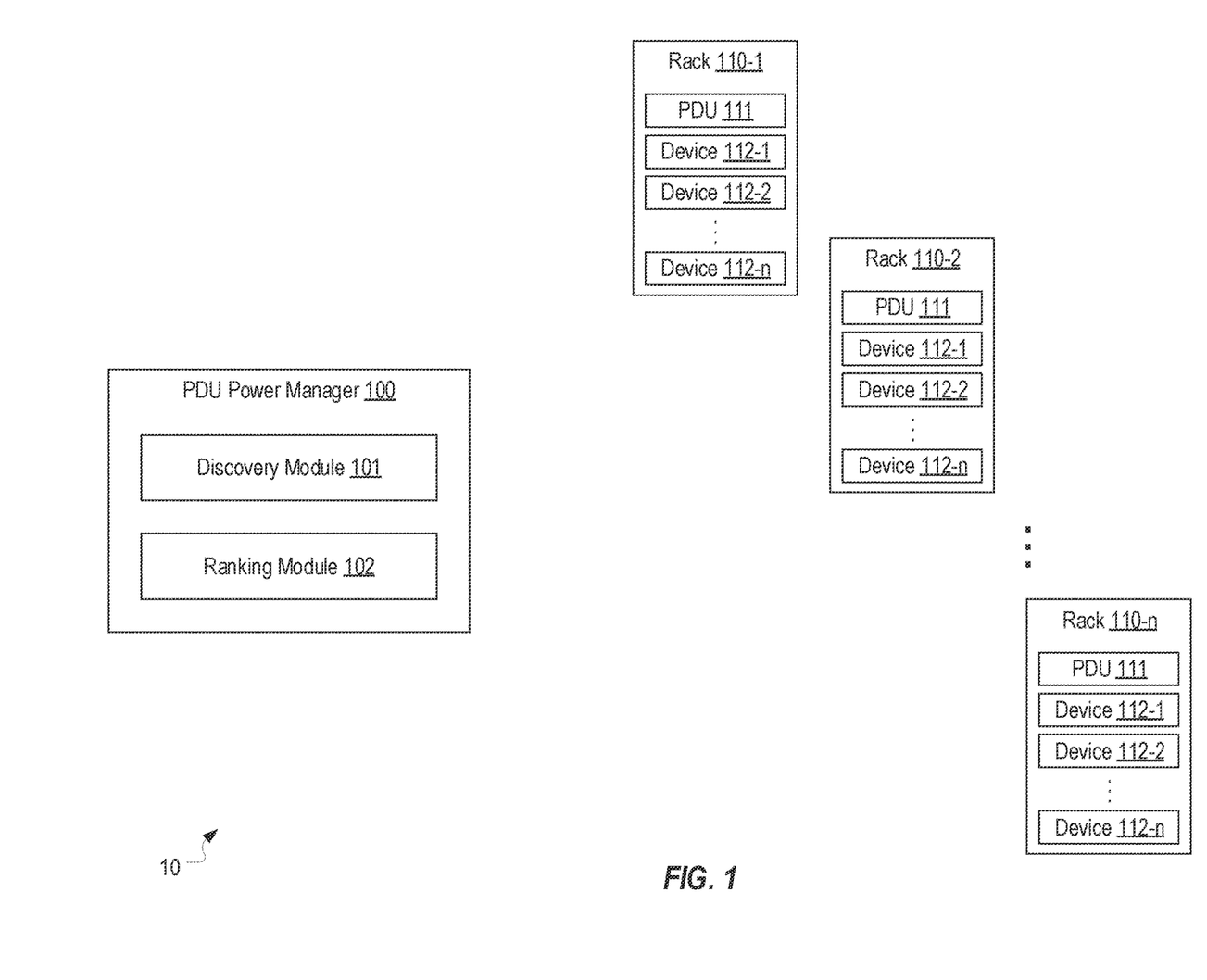
FIG. 1 illustrates an example computing environment in which embodiments of the present invention could be implemented.

FIG. 1 illustrates an example computing environment 10 in which embodiments of the present invention could be implemented. Computing environment 10 includes a PDU power manager 100 and some number of racks 110-1 through 110-*n* (individually or collectively rack(s) 110).

Each rack 110 can include a PDU 111 (or possibly more than one PDU) and a number of devices 112-1 through 112-*n* (individually and collectively devices 112) that are connected to PDU 111. Devices 112 could represent any type of device that may be housed in rack 110 and connected to PDU 111. For example, in some embodiments, devices 112 could all be servers. As another example, in some embodiments, devices 112 could include one or more network devices such as switches, hubs, routers, modems, etc.

PDU power manager 100 may be in the form of a service or other type of software component that runs on a computing device that has access to devices 112 in each rack 110. PDU power manager 100 is depicted as having a discovery module 101 and a ranking module 102. However, the logical structure and/or configuration of PDU power manager 100 is not essential to the present invention. Therefore, PDU power manager 100, including discovery module 101 and ranking module 102, should be construed based on their functionality described herein.

As an overview, PDU power manager 100 can be configured to implement a software-defined fail-safe power draw control technique to ensure that the power drawn from each PDU 111 does not exceed the PDU's power ratings. This technique can include identifying which devices 112 are connected to a particular PDU 111 including the sockets to which the devices are connected, determining the power ratings for each PDU 111 and its sockets and dynamically applying a power cap to each device 112 to ensure that PDU 111's power ratings are not exceeded. In some embodiments, this dynamic application of power caps to each device 112 can be based on rankings calculated for devices 112 and the workloads they perform. In some embodiments, workloads may be migrated between devices 112 to prevent devices 112 from reaching their assigned power caps.

FIGS. 2A-2D provide an example of how PDU power manager 100 may provide software-defined fail-safe power draw control in accordance with one or more embodiments of the present invention. This example is provided in the context of a single rack 110. However, it is to be understood that PDU power manager 100 could implement the functionality represented in this example for any number of racks 110 including all racks in a data center. In this example, it is assumed that a PDU 111 includes eight sockets 200-1 through 200-8 (collectively sockets 200) and that eight devices 112-1 through 112-8 are connected to sockets 200-1 through 200-8 respectively. This example describes the functionality using a sequence of steps. Although these steps could be performed in the depicted order, they could be performed in other orders in some embodiments.

Figure 2A:
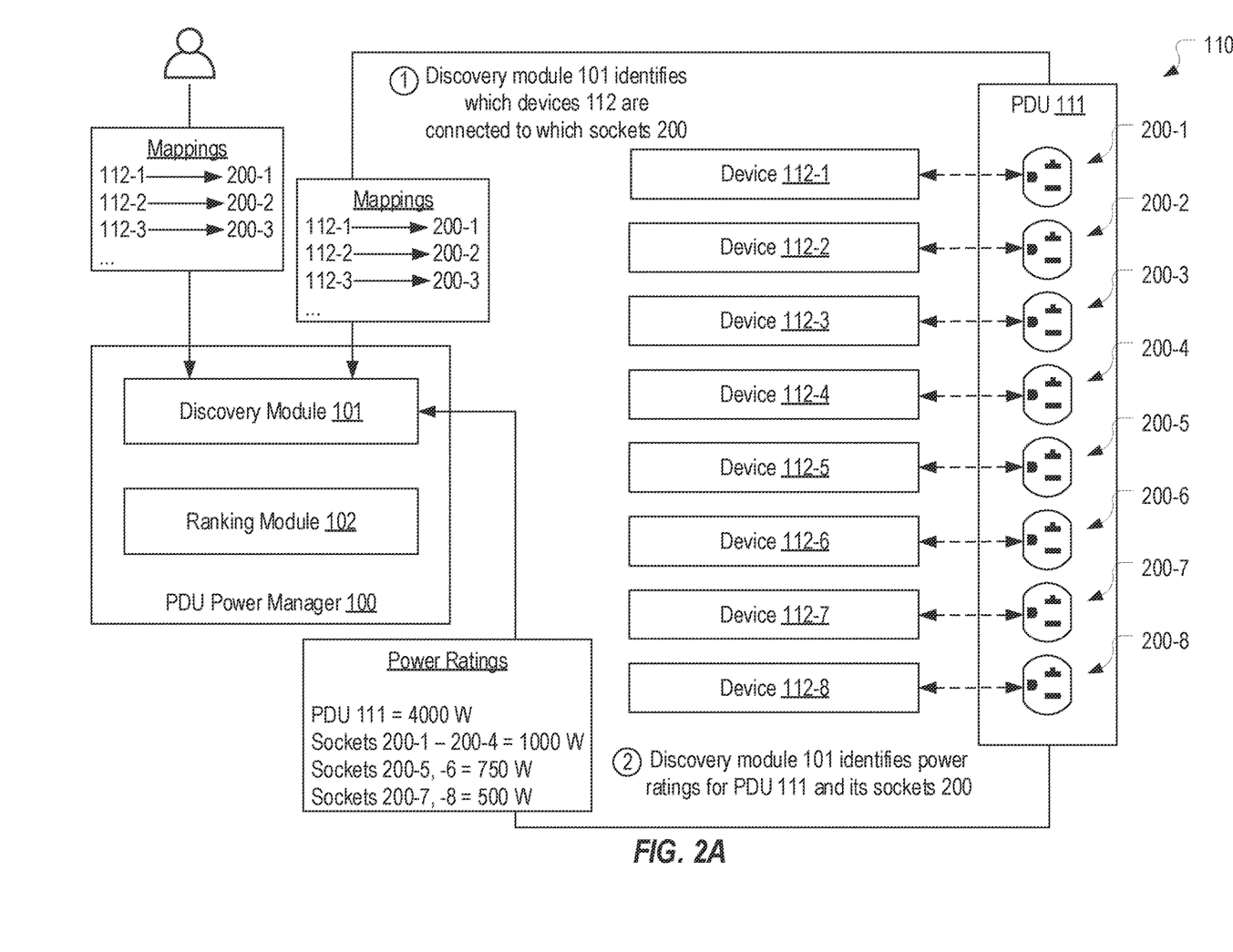
FIGS. 2A-2D provide an example of how a PDU power manager can provide software-defined fail-safe power draw control for one or more PDUs.

Turning to FIG. 2A, in step 1, discovery module 101 can obtain mappings which identify which devices 112 are connected to which sockets 200 of PDU 111. As represented, this step could be performed automatically and/or manually. For example, in some embodiments, discovery module 101 could leverage power line communication to automatically determine that at least some of devices 112-1 through 112-8 are connected to sockets 200-1 through 100-8 respectively. In contrast, in some embodiments, an administrator could manually input at least some of the mappings to discovery module 101.

In step 2, discovery module 101 can identify power ratings for PDU 111 and its sockets 200. For example, in some embodiments, discovery module 101 could query PDU 111 for these power ratings. In some embodiments, PDU 111 could include an agent that is configured to provide power ratings to discovery module 101. In contrast, in some embodiments, discovery module 101 could receive the power ratings through manual input or in any other suitable manner. As shown in FIG. 2A, it is assumed that discovery module 101 determines that the power rating for PDU 111 is 4000 W, the power rating for sockets 200-1 through 200-4 is 1000 W, the power rating for sockets 200-5 and 200-6 is 750 W and the power rating for sockets 200-7 and 200-8 is 500 W. Upon determining the mappings and the power ratings, discovery module 101 could create a data structure containing this information such as PDU info data structure 210 represented in FIG. 2B.

Figure 2B:
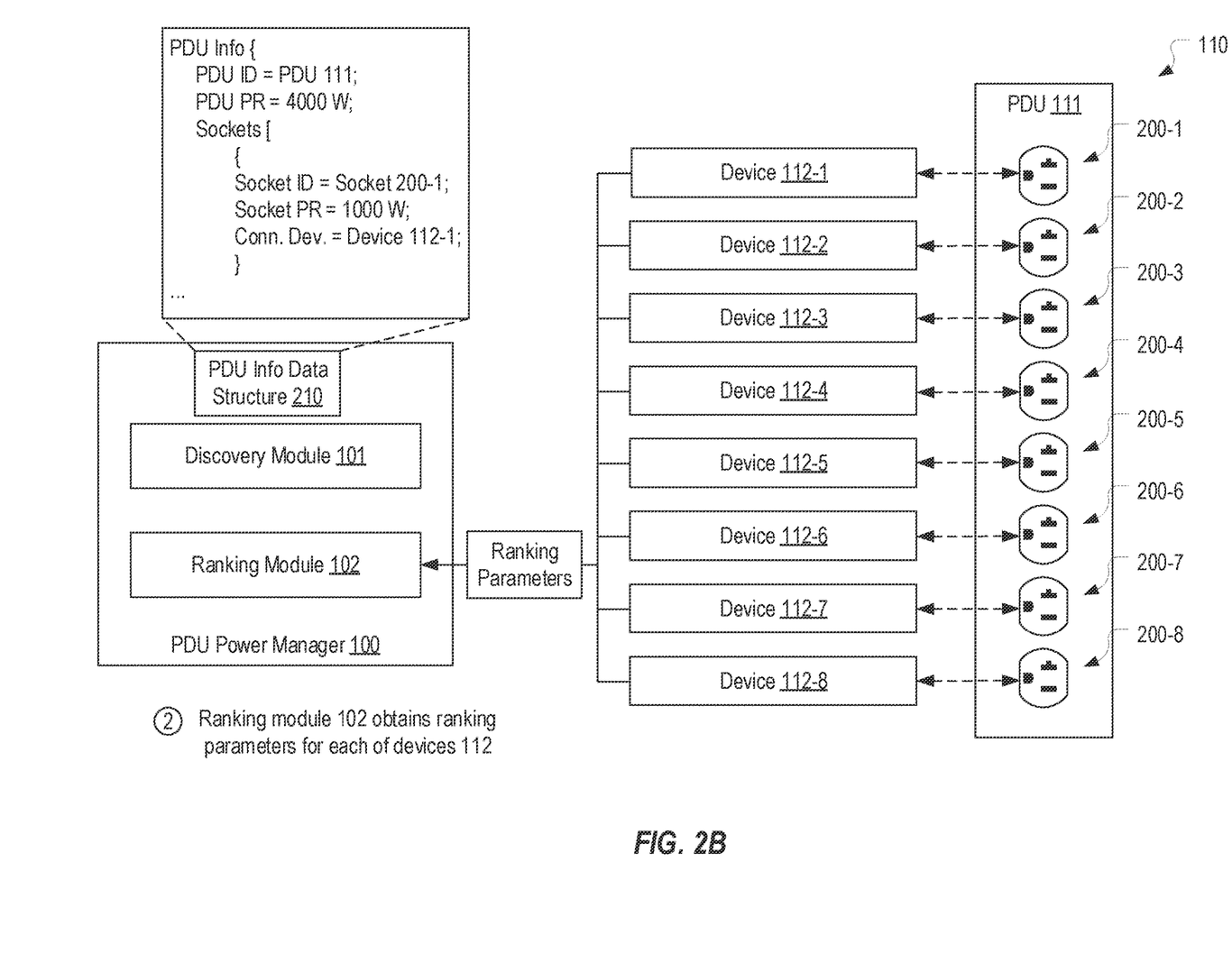

Turning to FIG. 2B, PDU info data structure 210 is shown as identifying PDU 111 and its power rating along with each of PDU 111's sockets, their power ratings and the connected devices 112. Notably, PDU power manger 100 could maintain such PDU information for each PDU that it manages.

In step 2, ranking module 102 can obtain ranking parameters for each of devices 112 to be used in calculating rankings for the devices. For example, using PDU info data structure 210, ranking module 102 could identify which devices 112 are connected to sockets 200 of PDU 111 and then query devices 112, or possibly other sources, for ranking parameters. These ranking parameters could include a variety of information such as one or more of vendor-specific benchmarks for devices 112, hardware characteristics for devices 112 and/or their components (e.g., a server model, CPU characteristics, GPU characteristics, memory characteristics, etc.), telemetry data representing resource utilization on devices 112 (e.g., power consumption, CPU utilization, memory utilization, IO utilization, inlet temperature, airflow (CFM), etc.), the workloads that are deployed on each device 112, a quality of service for the workloads deployed to devices 112, etc. Notably, ranking module 102 can be configured to repeatedly obtain/monitor at least some of the ranking parameters (e.g., to monitor telemetry data over time).

Figure 2C:
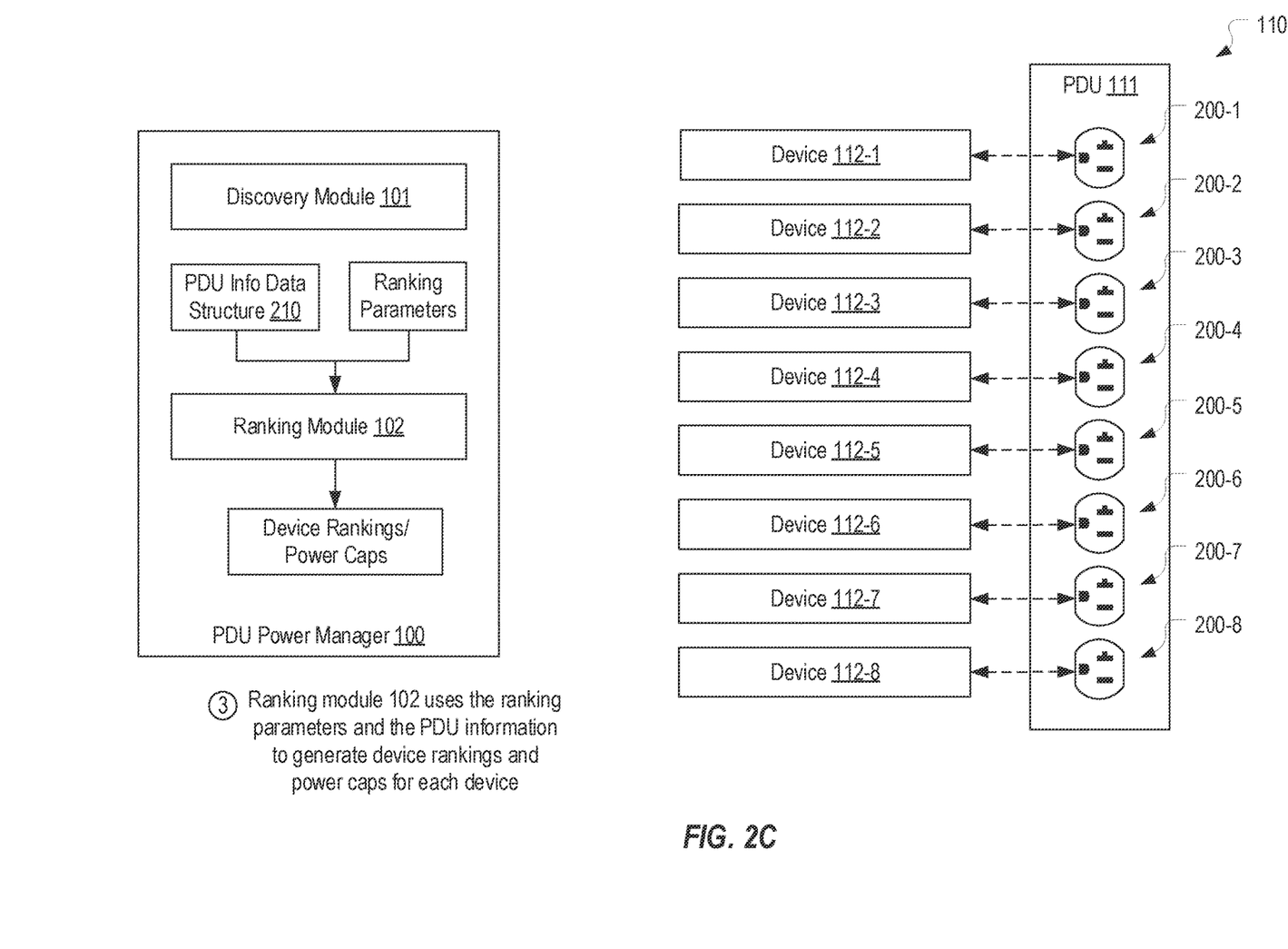

Turning to FIG. 2C, in step 3, ranking module 102 can use the ranking parameters and the PDU information to generate device rankings and power caps for each device 112. For example, using the ranking parameters that may be collected over time, ranking module 102 can calculate an average power metric for each device 112. In the case of a server, this average power metric may, in some embodiments, be based on maximum power consumption, average server utilization and/or average power scaling. In this context, maximum power consumption can be the wattage of the server when the server is at maximum utilization. Average server utilization can be the percentage of the server's computational ability that is used over a period of time. Average power scaling can be the extent to which the server uses less than maximum power when not operating at maximum utilization. In such cases, ranking module 102 can leverage the telemetry data it obtains over time to calculate the average power metric for each server in the rack.

Ranking module 102 may use these average power metrics to assign device rankings to each device 112 that is connected to PDU 111. For example, a device having a highest average power metric may be assigned a highest device ranking. In some embodiments, ranking module 102 may also consider other ranking parameters when assigning device rankings. For example, if workloads on a device 112 have QoS guarantees, ranking module 102 may assign a higher device ranking to the device than it otherwise would based on the average power metric alone.

To simplify the example, it is assumed that ranking module 102 generates device rankings in which device 112-1 and 112-2 have the same highest device ranking, devices 112-2 through 112-6 have the same second highest device ranking and devices 112-7 and 112-8 have the same third highest device ranking. However, ranking module 102 could assign a different device ranking to each device 112.

After generating device rankings for devices 112, which again can be done repeatedly as the ranking parameters are updated or changed, ranking module 102 can use the PDU information to assign a power cap to each device 112 based on the device rankings. For example, where devices 112-1 and 112-2 were assigned the highest device ranking, ranking module 102 can determine the power ratings of sockets 200-1 and 200-2, the sockets to which devices 112-1 and 112-2 are connected, and assign power caps that are a maximum percentage (e.g., 80%) of the sockets' power ratings. In this example, both sockets 200-1 and 200-2 have the same power rating (1000 W), and therefore, ranking module 102 could assign a power cap of 800 W to both devices 112-1 and 112-2.

To assign power caps to the remaining devices 121-3 through 121-8, ranking module 102 can consider the power rating for PDU 111 as well as the power ratings for sockets 200-3 through 200-8. For example, ranking module 102 can calculate a collective power cap for all devices 112 as a maximum percentage (e.g., 80%) of PDU 111's power rating and then assign power caps to devices 121-3 through 121-8 that ensure that the sum of the power caps assigned to devices 112 does not exceed the collective power cap. In this example, where PDU 111's power rating is 4000 W, the collective power cap could be 3200 W. With the 800 W power caps assigned to devices 112-1 and 112-2, there will be 1600 W remaining of the collective power cap to be assigned to devices 112-3 through 112-8. Based on the device rankings, ranking module 102 could determine that devices 112-3 through 112-6 should be assigned a power cap of 300 W and that devices 112-7 and 112-8 should be assigned a power cap of 200 W. In assigning these power caps, ranking module 102 can ensure that the power caps do not exceed the power rating (or a percentage (e.g., 80%) of the power rating) of the corresponding socket (e.g., by determining that the 200 W power cap assigned to device 112-8 is not greater than 80% of the 500 W power rating of socket 200-8).

Figure 2D:
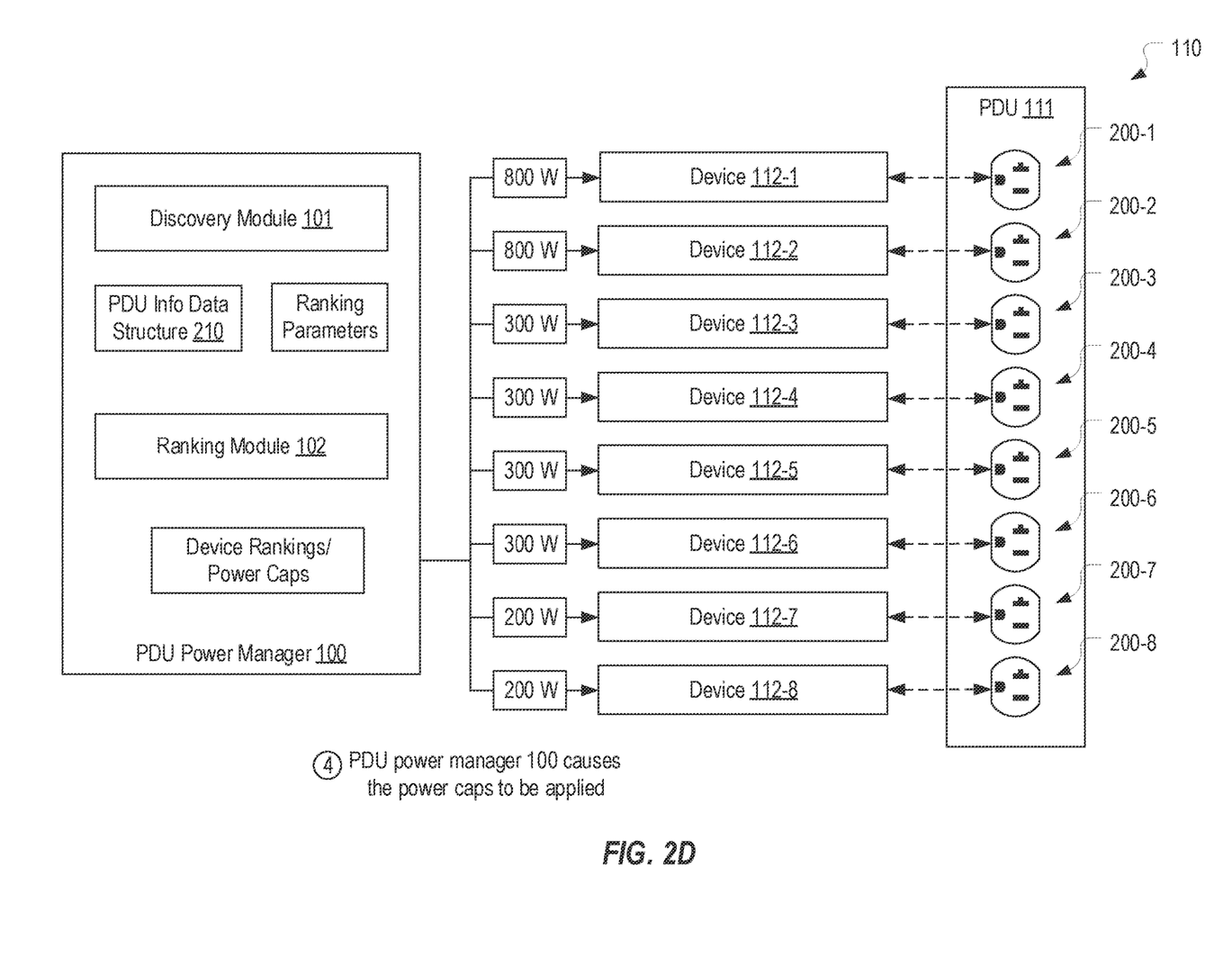

Turning to FIG. 2D, in step 4, PDU power manager 100 can cause the power caps to be applied. For example, in some embodiments, each of devices 112 may include a utility that can control the device's power draw. In such cases, PDU power manager 100 can notify the utility of the power cap that applies to the respective device 112 so that the utility will prevent the device from drawing power in excess of the power cap. For example, device 112-1 can be prevented from drawing more than 800 W from socket 200-1.

Through this process of assigning and applying power caps, ranking module 102 can ensure that the collective power drawn from PDU 111 will not exceed 80% (or another suitable percentage) of its power rating—even if each device 112 experiences a power spike at the same time—and that the power drawn by a single device 112 will not exceed 80% (or another suitable percentage) of the corresponding socket 200's power rating. Also, by assigning the power caps based on device rankings, ranking module 102 can ensure that devices 112 that are more likely to need higher power levels can obtain them. Furthermore, as ranking module 102 receives and processes additional ranking parameters, it may dynamically adjust these power caps to ensure that they match current or predicted workloads on devices 112.

Figure 3A:
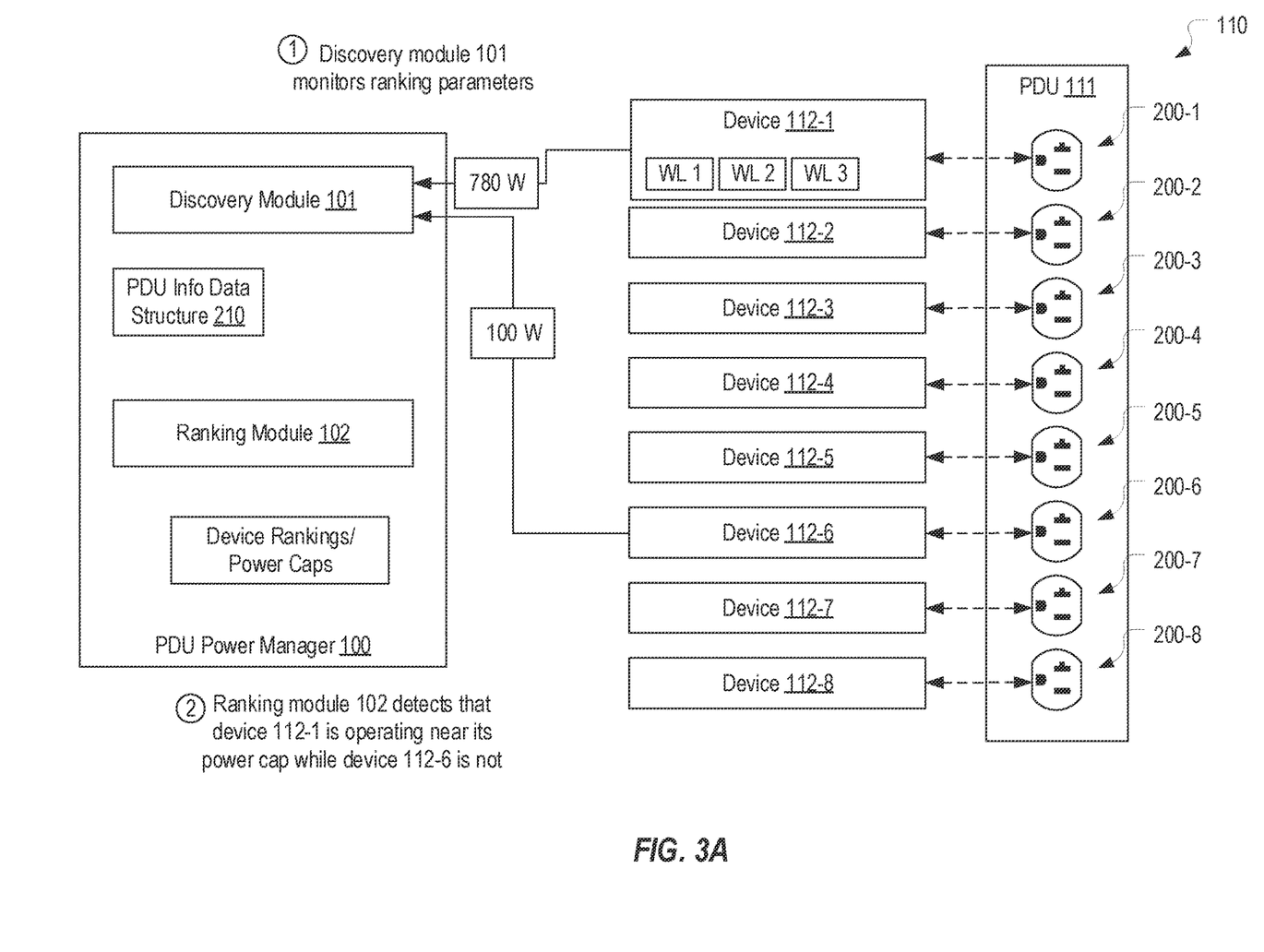
FIGS. 3A and 3B provide an example of how a PDU power manager can migrate workloads between devices that are connected to a PDU.
Figure 3B:
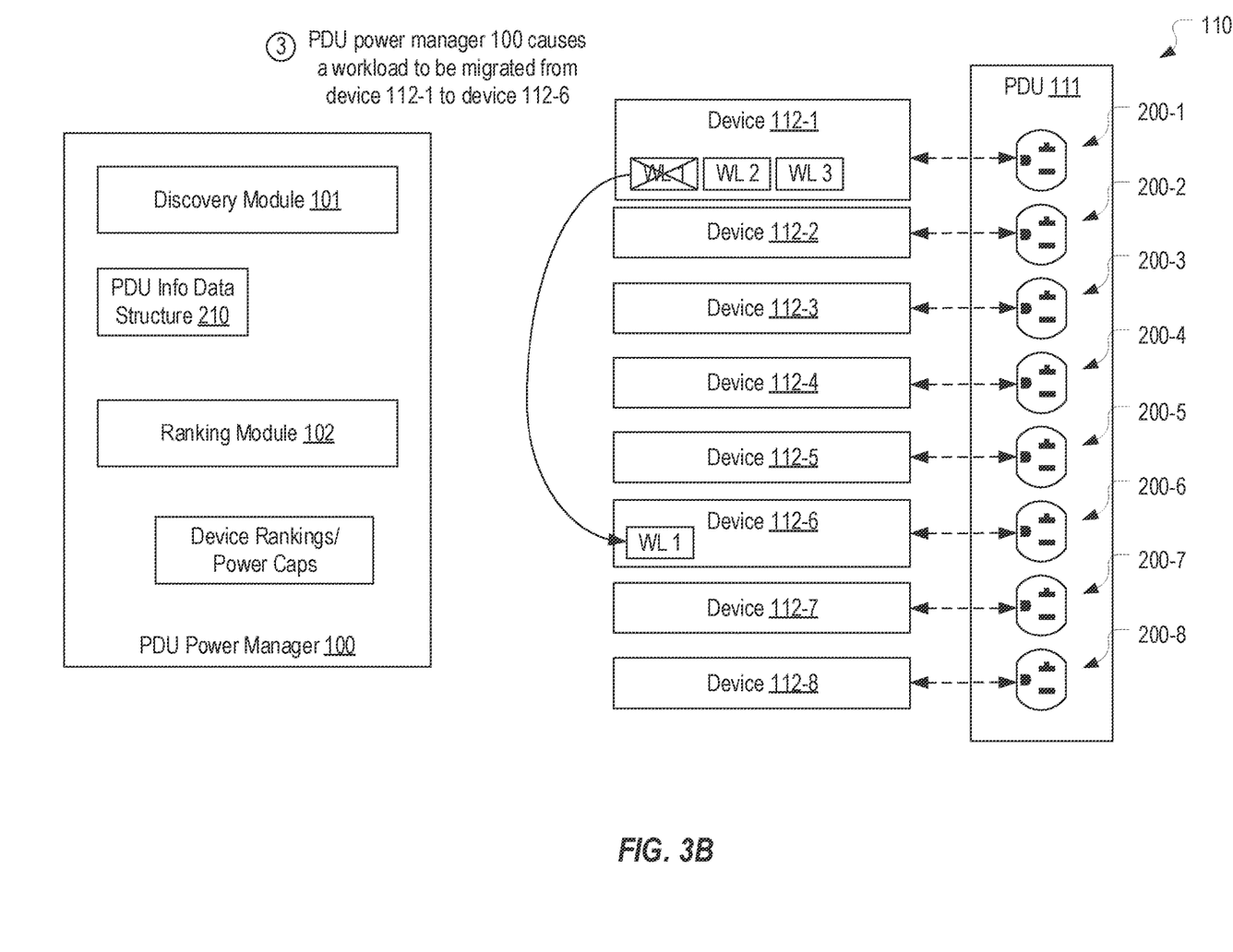

In some embodiments, in conjunction with monitoring ranking parameters and dynamically assigning power caps to devices 112, PDU power manager 100 may also cause workloads to be migrated between devices 112. Such migrations could be performed before or after applying or adjusting power caps. FIGS. 3A and 3B provide an example where a workload is migrated after the power caps are applied as described with reference to FIGS. 2A-2D above.

Turning to FIG. 3A, in step 1, discovery module 101 may continue to obtain/monitor ranking parameters from devices 112. For purposes of this example, it is assumed that this monitoring results in discovery module 101 determining that device 112-1 is drawing 780 W from socket 200-1 and that device 112-6 is drawing 100 W from socket 200-6. Such determinations could be made based on measured power, predicted power or some combination of measured and predicted power. For example, a service on devices 112 could report average power consumption over a period of time, predicted power consumption for a particular time period, etc.

Ranking module 102 may continue to evaluate the ranking parameters as part of dynamically generating/adjusting power caps, and as a result, in step 2, may detect that device 112-1 is operating near its 800 W power cap while device 112-6 is not operating near its 300 W power cap. In other words, ranking module 102 could determine that device 112-1 is likely to reach its power cap and therefore have its performance throttled, while device 112-6 is not.

Turning to FIG. 3B, in step 3, PDU power manager 100 may cause one or more workloads to be migrated from device 112-1 to device 112-6 to thereby minimize the likelihood that device 112-1 will reach its power cap. For example, PDU power manager 100 could interface with a virtual infrastructure manager that manages devices 112 in rack 110 to cause the virtual infrastructure manager to migrate workload 1, which could be a virtual machine or any other type of workload. In some embodiments, PDU power manager 100 could rely on the ranking parameters to identify which workload(s) should be migrated. For example, PDU power manager 100 could consider telemetry data specific to workloads 1, 2 and 3 on device 112-1 to determine that the amount of power consumed by workload 1 does not exceed the amount of power available on device 112-6 (i.e., the amount by which device 112-6's current power consumption falls below its power cap). In this way, PDU power manager 100 can ensure that the migration of workloads does not cause the destination device 112's power to exceed its power cap which in turn will ensure that the collective power drawn from PDU 111 will not exceed PDU 111's power rating.

To summarize, PDU power manager 100 can discover which devices are connected to which sockets of PDUs in a data center and the power ratings of the PDUs and sockets. PDU power manager 100 can also discover per-device power consumption such as in the form of an average power metric. By discovering this information for a collection of devices that are connected to the sockets of a PDU, PDU power manager 100 can dynamically calculate and apply power caps to each device to ensure that the PDU's power ratings will not be exceeded while efficiently utilizing the available power across the devices.

Embodiments of the present invention may comprise or utilize special purpose or general-purpose computers including computer hardware, such as, for example, one or more processors and system memory. Embodiments within the scope of the present invention also include physical and other computer-readable media for carrying or storing computer-executable instructions and/or data structures. Such computer-readable media can be any available media that can be accessed by a general purpose or special purpose computer system.

Computer-readable media are categorized into two disjoint categories: computer storage media and transmission media. Computer storage media (devices) include RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other similar storage medium which can be used to store desired program code means in the form of computer-executable instructions or data structures and which can be accessed by a general purpose or special purpose computer. Transmission media include signals and carrier waves. Because computer storage media and transmission media are disjoint categories, computer storage media does not include signals or carrier waves.

Computer-executable instructions comprise, for example, instructions and data which, when executed by a processor, cause a general-purpose computer, special purpose computer, or special purpose processing device to perform a certain function or group of functions. The computer executable instructions may be, for example, binaries, intermediate format instructions such as assembly language or P-Code, or even source code.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, smart watches, pagers, routers, switches, and the like.

The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices. An example of a distributed system environment is a cloud of networked servers or server resources. Accordingly, the present invention can be hosted in a cloud environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description.

What is claimed:

1. A method for providing software-defined fail-safe power draw control for a rack power distribution unit (PDU), the method comprising:
   identifying, at a PDU power manager, devices that are connected to sockets of a PDU such that each of the devices is identified as being connected to a particular one of the sockets of the PDU;
   identifying, at the PDU power manager, a power rating for the PDU and a particular power rating for each of the sockets of the PDU;
   generating a device ranking for each of the devices that are connected to the sockets of the PDU;
   based on the device rankings, the power rating for the PDU and the power ratings for the sockets of the PDU, generating power caps for the devices that are connected to the sockets of the PDU such that each of the power caps corresponds to a particular one of the sockets; and
   applying the power caps to the devices that are connected to the sockets of the PDU.

2. The method of claim 1, wherein the devices that are connected to the sockets of the PDU are identified automatically or via user input.

3. The method of claim 1, wherein the power rating for the PDU and the power ratings for the sockets of the PDU are identified automatically or via user input.

4. The method of claim 1, wherein the device rankings are generated based on average power metrics for the devices.

5. The method of claim 4, wherein the average power metrics are generated from ranking parameters obtained from the devices.

6. The method of claim 5, wherein the ranking parameters include telemetry information.

7. The method of claim 6, wherein the telemetry information includes one or more of maximum power consumption, average server utilization or average power scaling.

8. The method of claim 6, wherein the ranking parameters include one or more of benchmarks, hardware characteristics, workloads or quality of service.

9. The method of claim 1, wherein generating the power caps for the devices includes generating a power cap for each of one or more devices having a highest device ranking where the power cap is a percentage of the power rating of the socket to which the respective device is connected.

10. The method of claim 9, wherein generating the power caps for the devices includes generating a power cap for each of one or more devices that do not have a highest device ranking where the power cap is determined based on the power rating for the PDU.

11. The method of claim 10, wherein a sum of the power caps for the devices is a percentage of the power rating for the PDU.

12. The method of claim 1, further comprising:
   dynamically adjusting the power caps applied to the devices.

13. The method of claim 12, wherein the power caps are dynamically adjusted based on telemetry data obtained from the devices.

14. The method of claim 1, further comprising:
   based on the applied power caps, causing a workload to be migrated from a first device of the devices to a second device of the devices.

15. The method of claim 14, wherein the workload is caused to be migrated in response to determining that a power draw of the first device is approaching the power cap applied to the first device.

16. One or more computer storage media storing computer executable instructions which when executed implement a method for providing software-defined fail-safe power draw control for a rack power distribution unit (PDU), the method comprising:
   identifying, at a PDU power manager, devices that are connected to sockets of a PDU such that each of the devices is identified as being connected to a particular one of the sockets of the PDU;
   identifying, at the PDU power manager, a power rating for the PDU and a particular power rating for each of the sockets of the PDU;
   monitoring telemetry data from the devices; and
   based on the telemetry data, dynamically applying power caps to the devices where a sum of the power caps is a percentage of the power rating for the PDU.

17. The computer storage media of claim 16, wherein the power caps are assigned based on device rankings that are generated from the telemetry data.

18. The computer storage media of claim 16, wherein the devices are servers.

19. A computing system comprising:
   one or more processors; and
   computer storage media storing computer executable instructions which when executed implement a method for providing software-defined fail-safe power draw control for a rack power distribution unit (PDU), the method comprising:

based on a power rating for a PDU and a particular power rating for each of a plurality of sockets of the PDU, applying power caps to devices connected to the sockets of the PDU;

monitoring power draw of the devices while the power caps are applied to the devices; and based on the monitored power draw of the devices, causing one or more workloads to be migrated between the devices.

20. The computing system of claim 19, wherein the method further comprises:

based on the monitored power draw of the devices, modifying the power caps that are applied to the devices.

\* \* \* \* \*